United States Patent [19]
Palicot et al.

[11] Patent Number: 5,768,165
[45] Date of Patent: Jun. 16, 1998

[54] DIGITAL TIME SIGNAL FILTERING METHOD AND DEVICE FOR TRANSMISSION CHANNEL ECHO CORRECTION

[75] Inventors: Jacques Palicot; Moise Djoko Kouam, both of Rennes; Jacques Veillard, Montgermont, all of France

[73] Assignee: France Telecom & Telediffusion De France TDF, Paris, France

[21] Appl. No.: 513,807

[22] PCT Filed: Mar. 9, 1994

[86] PCT No.: PCT/FR94/00259

§ 371 Date: Sep. 8, 1995

§ 102(e) Date: Sep. 8, 1995

[87] PCT Pub. No.: WO94/21041

PCT Pub. Date: Sep. 15, 1994

[30] Foreign Application Priority Data

Mar. 10, 1993 [FR] France ................. 93 02977

[51] Int. Cl.$^6$ ............... G06F 17/10; H04M 1/00; H04M 9/00; H04M 9/08
[52] U.S. Cl. .............. 364/724.01; 364/724.1; 364/724.12; 364/724.18; 348/614; 379/406; 379/410
[58] Field of Search .............. 364/724.01, 724.1, 364/724.12, 724.16, 724.17, 724.18, 724.19, 725, 726, 727, 728.01, 728.07, 728.03, 82.7; 348/614; 367/135, 87, 900, 901, 903; 379/406, 410, 411

[56] References Cited

U.S. PATENT DOCUMENTS

| | | | |
|---|---|---|---|
| 4,701,875 | 10/1987 | Konishi et al. | 364/728.01 |
| 4,797,847 | 1/1989 | Duhamel | 364/725 |
| 4,951,269 | 8/1990 | Amano et al. | 367/135 |
| 5,276,516 | 1/1994 | Bramley | 348/614 |
| 5,473,555 | 12/1995 | Potter | 364/724.1 |

OTHER PUBLICATIONS

Proceedings: ICASSP 87, International Conference on Acoustics, Speech, and Signal Processing Apr. 6, 7, 8, 9, 1987 Registry Hotel, Dallas, Texas vol. 4 of 4.

*Primary Examiner*—Reba I. Elmore
*Assistant Examiner*—Emmanuel L. Moise
*Attorney, Agent, or Firm*—Kerkam, Stowell, Kondracki & Clarke, P.C.; John C. Kerins

[57] ABSTRACT

A method for filtering a time signal (e(t)) sampled in blocks of N samples (e(n),e(k)) uses a transfer function defined in the frequency domain by LN samples (H(K)). The transfer function is filtered by a time window (g1) of width N, and a frequency subsampling of ratio N is performed to give a partial transfer function defined over N samples (H1(k)). The method enables the complexity of circuits operating in real time to be optimized. The technique is particularly suitable for correcting long echoes in television picture receivers.

12 Claims, 6 Drawing Sheets

DIGITAL TIME SIGNAL FILTERING METHOD AND DEVICE FOR TRANSMISSION CHANNEL ECHO CORRECTION

BACKGROUND OF THE INVENTION

The invention relates to a process for digitally filtering time signals such as those received from a transmission channel or a broadcasting network.

It also relates to a digital filtering device for implementing the process.

The invention is particularly advantageous to realize echo correction at the level of a receiver connected to a transmission system such as a television network.

Generally, digital filtering relates to a digital time signal, that is, one which results from a sampling at the rate of a given sampling period T generally imposed in accordance with requirements that the processing allow for a determined bandwidth, for example. Thus a video signal in conformity with the D2-MAC standard, for example, is sampled for a period of 49.38 nanoseconds.

Digital filtering of such a signal can be performed in the frequency domain, that is, from the discrete Fourier transform of the digital time signal. In this case, the filtering is defined by a transfer function which is also sampled at a given frequency sampling interval df. This transfer function, then is the sampled Fourier transform of the time impulse response of the filter to be produced.

Mathematically, the filtering consists of calculating, at each sampling period T, the convolution product of the time signal and the impulse response of the filter. In the time domain, the result of the convolution produces the filtered signal directly. If the filter is defined by its transfer function in the frequency domain, the convolution is reduced to a simple product (in the complex space) of the discrete Fourier transform of the time signal to be filtered by the transfer function of the filter for each of the frequency values for which the transfer function is defined. The result of this complex product furnishes the discrete Fourier transform of the filtered signal. An inverse discrete Fourier transform makes it possible to return to the time domain.

In order for this filter to be achievable in practice, the number of samplings in the time and frequency domains is obviously limited. This results in conditions and limitations relative to the ranges of definition for time and frequency quantities. Thus, in conformity with Shannon's theorem, the time sampling at the period T imposes a limitation on the bandwidth of the signal which can be filtered. This first condition can be expressed by saying that the sampling frequency 1/T of a real time signal must be more than double its bandwidth DF. The sampling in the frequency domain also involves a second condition: the time signal to be filtered is only taken into account during a limited time interval DT of a duration at most equal to the inverse 1/df of the sampling interval df in the frequency domain. The maximum interval 1/df thus defines a time window which will henceforth be called the "time horizon" of the filter.

The first of the preceding conditions is met by limiting the bandwidth of the time signal by means of filtering and/or by choosing a sampling frequency 1/T which is high enough. The second condition will also be met if the time signal can be represented by means of a limited number of samplings processed by the filter at each sampling period.

If the discrete Fourier transform mentioned above is used, a limited number N of samplings in the time domain is used to calculate the same number N of samplings in the frequency domain. The two preceding conditions can therefore be summed up by the following relations:

$$T \leq 1/(2\,DF) \quad (1)$$

$$df \leq 1/DT \quad (2)$$

$$N.df \leq 2DF \quad (3)$$

$$N.T \leq DT \quad (4)$$

in which:

T is the time sampling period df is the frequency sampling interval

N is the number of samplings used for the discrete Fourier transform

DF is the bandwidth of the time signal

DT is the time horizon of the filter.

A time signal filtering operation by means of a digital filter H is summarized in theory in FIG. 1, which shows the operations performed in the time and frequency domains as well as the correspondences between one domain and the other. The upper part of the figure shows the various time parameters involved in the filtering, while the lower part shows the corresponding parameters (by Fourier transform) in the frequency domain.

Thus, the time signal e(t) to be filtered (assumed to be continuous) is sampled at the period T and converted into a digital quantity by the converter A/N which furnishes the sampled digital signal e(nT), in which n is the rank of the corresponding sampling e(n). Since the filter H is assumed to be defined by its sampled impulse response h(n), the filtering operation consists of calculating the convolution product:

$$s(n)=h(n)*e(n)$$

The result of this convolution product furnishes the sampled output time signal s(nT) of the filter. A digital-to-analog conversion N/A of this signal makes it possible to obtain an analog output time signal s(t).

The same filtering in the frequency domain is represented in the lower part of the figure. The input signal E(f) is the transform of the time signal e(t). This signal is sampled at a sampling interval df and converted into a digital quantity by the converter A/N which furnishes the sampled frequency signal E(k·df). As the filter H is assumed to be defined in the frequency domain, the filtering operation consists of obtaining the complex product of the samplings E(k·df) multiplied by the samplings of the same rank k of the transfer function sampled in the frequency domain H(k·df). The results of these products constitute the output sampled in the frequency domain S(k·df) of the filter. A digital-to-analogue conversion N/A makes it possible to work in the continuous frequency domain instead.

As previously indicated, the practical realization of a time signal filtering imposes a limitation on the number of samplings of the signal to be filtered and the transfer function which are involved in the operations just described. FIG. 2 illustrates a conventional filtering carried out in the frequency domain in which the number of samplings is limited to the value N. In this case, the continuous time signal e(t) appears in the form of a vector or block of samplings [e(n)] obtained by, for example, a sampling at the period T followed by an analog-to-digital conversion A/N and a serial-to-parallel conversion S-P which affects N successive samplings e(nT). Since the transfer function H of the filter itself is assumed to be sampled over N samplings, it also appears in the form of a block of samplings [H(k)]. Strictly speaking, then, the filtering consists of obtaining in parallel the products of the samplings H(k) of the transfer function H multiplied by those of the same rank E(k) which represent the discrete Fourier transform of the sampled time signals e(n). This discrete Fourier transform TFD operates over N samplings [e(n)] of the time signal and can be carried out by means of a circuit which uses an algorithm of the "fast Fourier transform," or FFT, type. The products S(k) of the samplings E(k) times H(k) define the discrete Fourier transform of the output time signal s(n) which results from the filtering. The output time signal is obtained by means of an inverse discrete Fourier transform $TFD^{-1}$ which operates on each block of N products [S(k)]. A parallel-to-serial conversion P-S at the rate of the sampling period T furnishes the time signal S(t) at the instants t=nT.

It is certain that the complexity of the filter to be produced is directly linked to the size of the operators which execute the direct and inverse discrete Fourier transforms, that is, to the number N of samplings processed by these operators. For example, it is possible to demonstrate that the number of multiplications necessary to produce a fast Fourier transform of the size N is equal to $N \cdot \log_2(N)$. Thus, it is advantageous to choose the smallest possible number N which is compatible with the conditions (1) and (4) defined previously. It would be desirable, however, for the sampling of the transfer function H of the filter to also satisfy conditions (2) and (3).

In the case in which the transfer function H used is defined in the frequency domain with very high precision, that is, with a very large number of samplings H(K) separated by a very small frequency sampling interval df, these samplings cannot be used directly since the conditions (1) through (4) would not generally be satisfied. In other words, this means that the time horizon 1/df of the filter defined by its transfer function H(K) is greater than the time horizon N·T, which would be sufficient to filter the signal. If it is assumed, for example, that the inverse 1/df of the sampling df of the transfer function H is a multiple L of the time horizon NT, the direct utilization of the samplings H(K) would normally require discrete Fourier transforms of a size LN, which would make them uselessly oversized.

The problem, then, is the following. A transfer function H defined over a number L·N of samplings H(K) is used even though only N samplings would be enough to filter time signal e(n). The object of the invention is to find a filtering process which uses a transfer function H1 defined by N samplings H1(k) and which can represent the transfer function H defined by L·N samplings H(K) with sufficient precision.

SUMMARY OF THE INVENTION

In keeping with this object, the invention proposes a process for the filtering by means of a transfer function of a digital time signal sampled at a sampling period T and represented by its discrete Fourier transform defined by blocks of N samplings in the frequency domain, this transfer function being sampled in the frequency domain and defined for a number LN of samplings, L being a whole number greater than or equal to 2, characterized in that, prior to the processing of the time signal, a partial transfer function is calculated which is defined in the frequency domain by the following steps:

definition of a function in the time domain, called a time window, which has a value other than zero within a time interval of a duration equal to N times the sampling period T, and which assumes a value of zero or tending toward zero outside this interval, calculation of the cyclic convolution product over LN samplings of the transfer function sampled by the discrete Fourier transform of the time window, subsampling of this convolution product in the ratio L in order to define N samplings of the partial transfer function, and in that the respective products of these samplings of the partial transfer function multiplied by the samplings of the same rank of the discrete Fourier transform of the time signal are obtained in real time.

It is advantageously possible to define the time window by means of a function sampled in the time domain, and in this case, according to another aspect of the invention, the cyclic convolution product consists of carrying out a calculation of the inverse discrete Fourier transform of this sampled transfer function, obtaining the respective products of the samplings of the inverse discrete Fourier transform multiplied by the samplings of the same rank of the sampled time window, and calculating the discrete Fourier transform of these products.

In another aspect of the invention, the time window is chosen so that its integral relative to time is equal to N times the sampling period T.

The process just defined actually makes it possible to adjust the time horizon of the filter to that of the time signal to be filtered when the initial transfer function H of the filter is defined too narrowly for the requirements of the filtering. The result is an optimization of the size and complexity of the discrete Fourier transform circuits (such as FFT and $FFT^{-1}$) which must function in real time. While still within the object of reducing the size of these circuits, this problem is linked to a complementary problem which may be expressed as follows. A transfer function, in the form of samplings with a given frequency sampling interval df, is used. In order to filter a time signal, it is desirable to use discrete Fourier transforms of reduced size N, whereas the time horizon of the signal which is normally necessary for filtering is greater than NT but less than 1/df. It has already been seen how the time horizon of the filter may be reduced. What now remains is to find a permanent solution which makes it possible to increase the time horizon without increasing the size N of the discrete Fourier transform circuits.

Another subject of the invention is a filtering process which makes it possible to solve this problem. More precisely, the invention relates to a process for the filtering by means of a transfer function of a digital time signal sampled at a sampling period T and represented by its discrete Fourier transform defined by blocks of N samplings in the frequency domain, this transfer function being sampled in the frequency domain and defined for a number LN of samplings, L being a whole number greater than or equal to 2, characterized in that, prior to the processing of the time signal, M partial transfer functions are calculated, which are defined in the frequency domain by the following steps:

definition of M successive time intervals, each having a duration equal to N times the sampling period T, for each of these intervals, definition in the time domain of a function, called a time window, which has a value other than zero within the associated time interval and which assumes a value of zero or tending toward zero outside this interval, calculation of the cyclic convolution products over LN samplings of the sampled transfer function multiplied by the discrete respective Fourier transforms of these time windows, subsampling of these convolution products in the ratio L so as to define N samplings of each of the partial transfer functions, and in that the sum of partial frequency signals organized into M blocks of N samplings, which respectively result from the products of the samplings of the M partial transfer functions multiplied by samplings of the same rank of M successive blocks of N samplings of this discrete Fourier transform of the time signal is obtained in real time.

In a variant which makes use of the linear properties of the Fourier transforms, the invention also relates to a process for the filtering by means of a transfer function of a digital time signal sampled at a sampling period T and represented by its discrete Fourier transform defined by blocks of N samplings in the frequency domain, this transfer function being sampled in the frequency domain and defined for a number LN of samplings, L being a whole number greater than or equal to 2, characterized in that, prior to the processing of the time signal, M partial transfer functions are calculated, which are defined in the frequency domain by the following steps:

definition of M successive time intervals, each of which has a duration equal to N times the sampling period T, for each of these intervals, definition in the time domain of a function, called a time window, which has a value other than zero within the associated time interval and which assumes a value of zero or tending toward zero outside this interval, calculation of the cyclic convolution products over LN samplings of this sampled transfer function multiplied by the respective discrete Fourier transforms of these time windows, subsampling of these convolution products in the ratio L so as to define N samplings of each of the partial transfer functions and in that the sum of partial frequency signals organized into M blocks of N samplings, which respectively result from M successive products of the samplings of the M partial transfer functions multiplied by the samplings of the same rank of N samplings of the discrete Fourier transform of the time signal.

Thus, the invention makes it possible to break down a defined transfer function into any number of samplings in a bank of elementary filters, each of which is defined by a lower number of samplings. The result is that the global complexity of the necessary circuits is lower than that which would result from the direct utilization of the samplings of the initial transfer function.

Another subject of the invention is the application of the filtering process just defined to echo correction in a transmission channel. In this case, the filtering affects a sampled digital time signal which is present at the level of a receiver connected to the transmission channel, this transfer function being determined from the calculation of the inverse of the transfer function in the frequency domain of this channel.

Another subject of the invention is a digital filter for implementing the process according to the invention. This filter is characterized in that it includes a digital calculator programmed to calculate the samplings of the partial transfer functions and equipped with an output interface which makes it possible to issue these samplings, and in that this filter includes hardwired circuits for calculating the discrete Fourier transform of the time signal as well as the products of the samplings of this partial transfer function multiplied by the samplings of the same rank of the discrete Fourier transform of the time signal.

In the case of an embodiment in a filter bank, the filter according to the invention is characterized in that it includes a digital calculator programmed to calculate the samplings of the partial transfer functions and equipped with an output interface which makes it possible to issue these samplings, and in that this filter includes hardwired circuits for calculating the discrete Fourier transform of the time signal, as well as the products of the samplings of the partial transfer functions multiplied by the samplings of the same rank of the discrete Fourier transform of the time signal.

BRIEF DESCRIPTION OF THE DRAWINGS

Other aspects, details of embodiment and advantages of the invention will appear in the remainder of the description, in reference to the figures.

DESCRIPTION OF THE PREFERRED EMBODIMENTS

In order to facilitate comprehension of the rest of the explanations, the following conventional notations will be used:

L, M and N are integers, with $M \geq L$;

the signals or transfer functions (impulse responses) are in lower case when they are expressed in the time domain and in upper case in the frequency domain;

n or m designates the rank of the current sampling of a signal or an impulse response in the time domain, with $o \geq n \geq N-1$ and $o \geq m \geq LN-1$ k or K designates the rank of a current sampling of a signal or an impulse response in the frequency domain, with $o \geq 1 \geq N-1$ and $o \geq K \geq LN-1$;

the references between brackets designate blocks of samplings which have a size N or LN depending on whether they contain, respectively, the rank symbols n, k or m, K.

Figure 1:
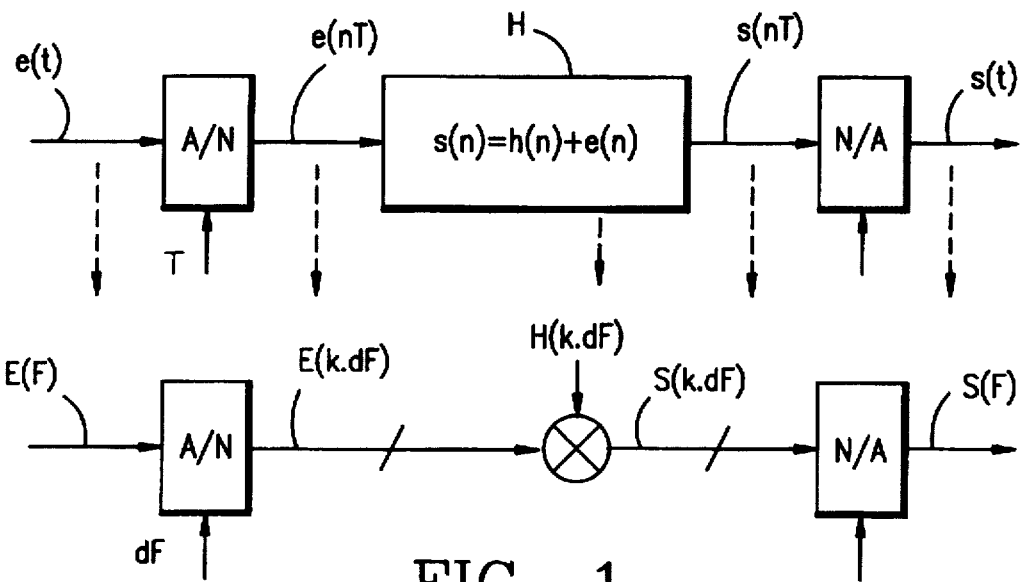
FIGS. 1 and 2 are schematic diagrams for introducing the various signals used.
Figure 2:
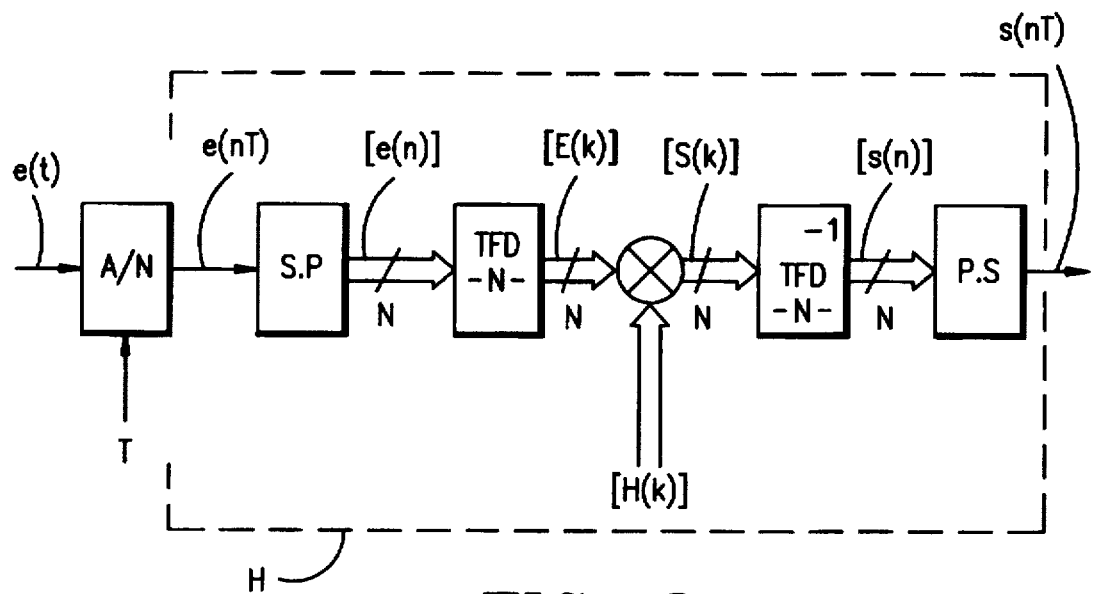
Figure 3:
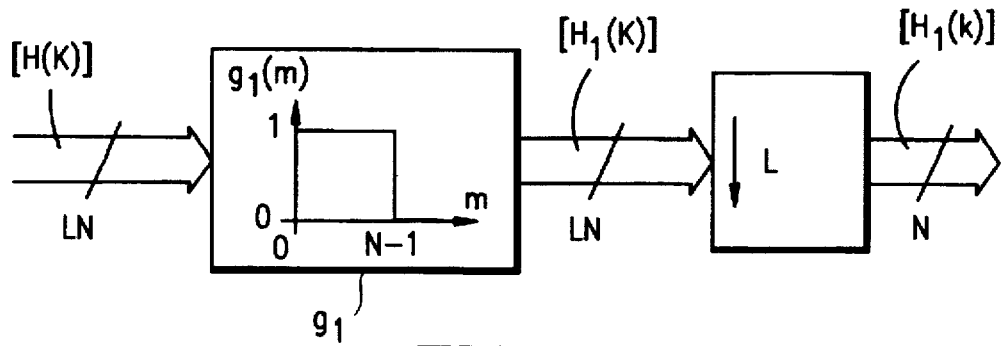
FIG. 3 is a schematic diagram of the process according to the invention.

FIGS. 1 and 2 have been used above to illustrate the different quantities that are likely to be involved in a conventional digital filtering. In this case, the number N of samplings H(k) which defines the transfer function H of the filter is equal to that of the samplings e(n) or e(k) of the time signal defined in the time or frequency domain. In order to restore this condition when a greater number LN of samplings H(K) of the transfer function H defined in the frequency domain is used, according to the invention a processing of these samplings is carried out in such a way as to define a new transfer function H1 represented by N samplings H1(k). This transform is illustrated in FIG. 3.

It consists first of all of defining in the time domain a time window g1 which can be represented by a function which assumes the value 1 (with a near-scale coefficient) within a time interval of a duration equal to N times the sampling period T. The convolution product of the sampled transfer function [H(K)] multiplied by the discrete Fourier transform [G1(K))] of this time window g1 is calculated in order to obtain LN samplings [H1(K)]. Then a subsampling of [H1(K)] in the ratio L is carried out in order to obtain the desired transfer function H1 defined over N samplings H1(k). By applying these samplings [H1(k)] to the input [H(k)] of the filter represented in FIG. 2, the desired filtering of the time signal e(t) defined over the time horizon NT is obtained.

Figure 4:
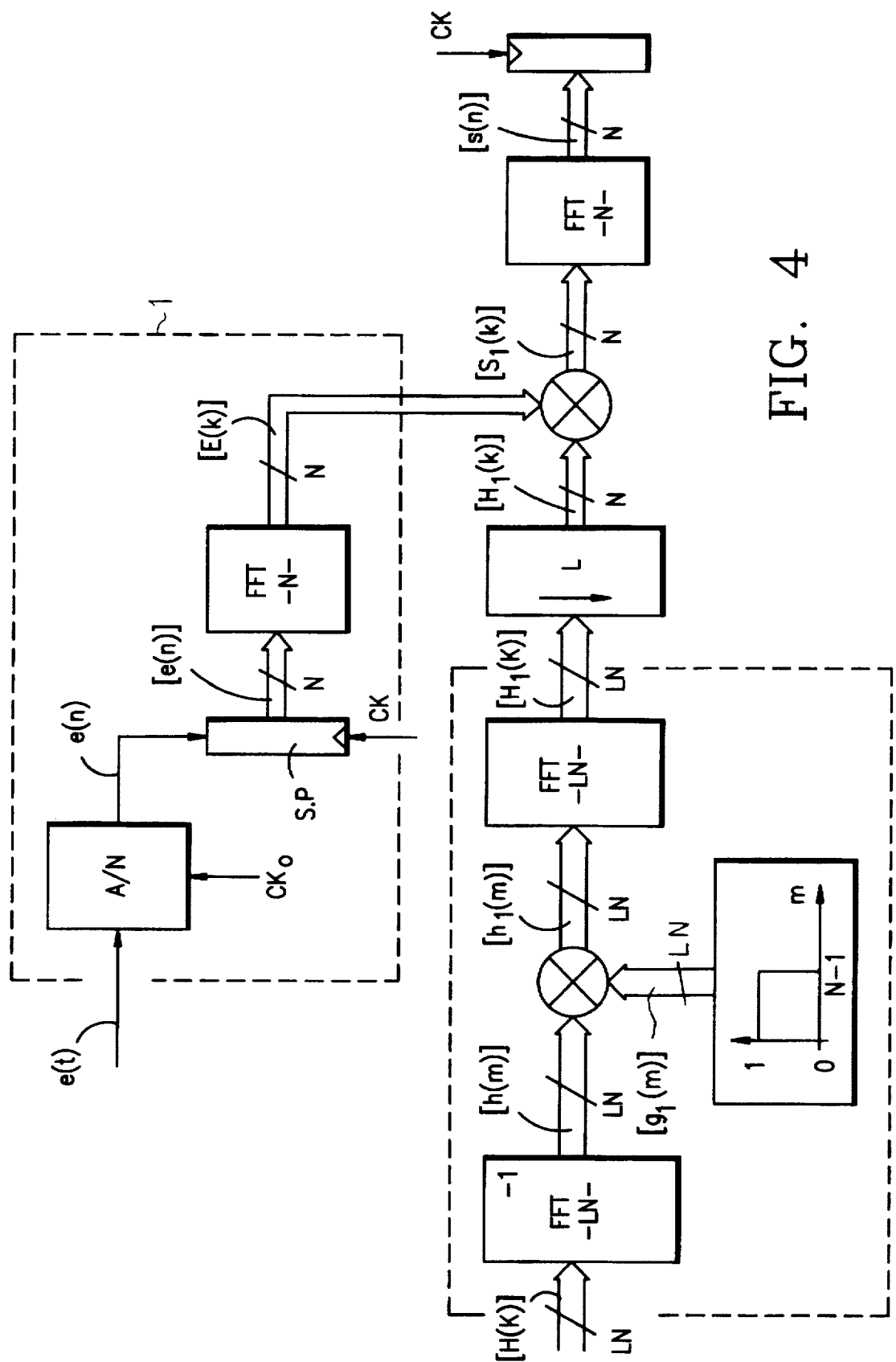
FIG. 4 represents the principle elements which constitute the filter according to the invention.

FIG. 4 is an assembly diagram of one variant of the filter which implements the preceding process. The filter includes a circuit 1 for calculating in real time the discrete Fourier transform defined by blocks [E(k)] of N samplings of the time signal e(t) to be filtered. The circuit 1 includes an analogue-to-digital converter A/N which receives the continuous time signal e(t) and which is sequenced by a clock signal CK0 with the period T. The converter A/N furnishes, at each period T, the sampled signal e(n) applied to the input of a serial-to-parallel converter S-P synchronized by a clock signal CK with the period NT in such a way as to furnish blocks of N samplings [e(n)]. By processing this block by means of a discrete Fourier transform circuit FFT–N of the size N, the discrete Fourier transform [(E(k)] is obtained. Of course, the circuit 1 would be superfluous if other means were used for the samplings E(k).

FIG. 4 also shows one particular way to produce the convolution of the initial transfer function [H(K)] by means of the time window g1 defined previously. In this embodiment, the time window g1 is in the form of a sampled function g1(m) defined over LN samplings in the time domain. In this case, the impulse response [h(m)] of [H(K)] is calculated by an inverse Fourier transform. For example, it is possible to use an operator of the "inverse fast Fourier transform" type FFT$^{-1}$–LN of the size LN. This transform furnishes LN samplings [h(m)] which are multiplied by the samplings of the same rank in the time window [g1(m)]. A Fourier transform FFT–LN of these products [h1(m)] furnishes LN samplings [H1(K)]. As before, these samplings are subsamplings in a ratio L so as to furnish N samplings [H1(k)].

The circuit includes multipliers for obtaining, in parallel and in real time, the products of the samplings H1(k) multiplied by the samplings of the same rank k of the discrete Fourier transform E(k) of the time signal. These products furnish the samplings [S1(k)] which constitute the discrete Fourier transform of the output signal of the filter. From these samplings [S1(k)], it is possible to obtain the sampled output signal in the time domain s(n) by means of an inverse discrete Fourier transform FFT$^{-1}$–N.

Figure 5:
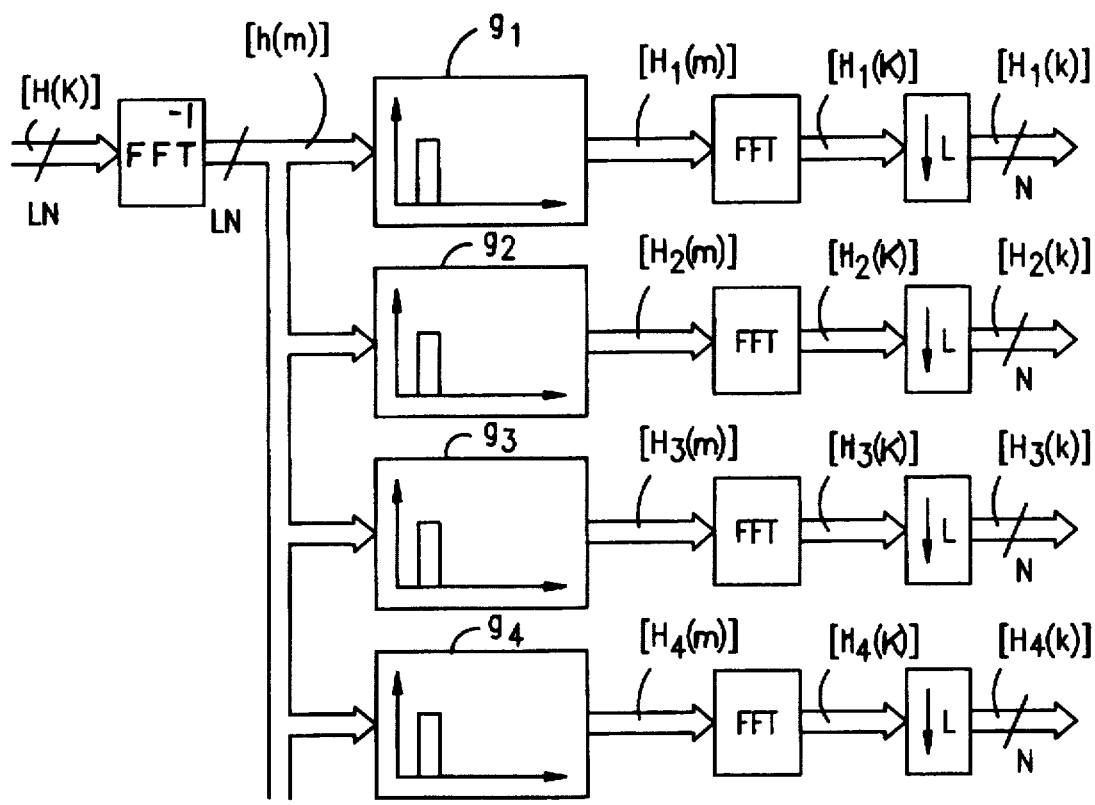
FIG. 5 represents the elements of the filter bank according to the invention for defining the partial transfer functions.
Figure 6:
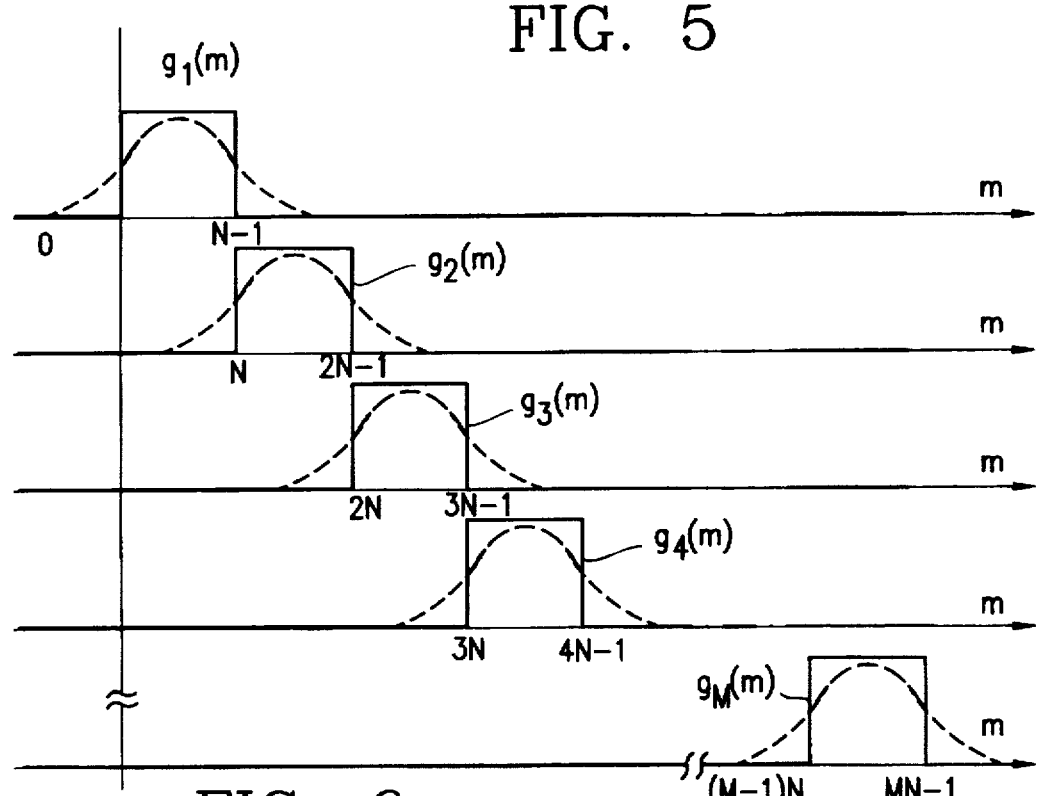
FIG. 6 represents diagrams which define the time windows used in the filter bank in FIG. 5.

FIG. 5 represents a generalization of the preceding filter in the form of a filter bank which performs a breakdown of the initial transfer function H(K) into M partial transfer functions H1, . . . , H4, . . . each of which is defined over N samplings, with M≧L. For this purpose, M time windows g1, g2, . . . , gM are defined, as represented in the diagram in FIG. 6. Each of these windows corresponds to a time horizon of a duration NT, and therefore the juxtaposition of M adjacent windows makes it possible to define a time horizon of a duration M.NT. It must be noted that the time windows are not necessarily rectangular windows but can also have the appearance represented in the diagram by a dotted line so that they project beyond both sides of the rectangular reference window while retaining the same surface area. This disposition makes it possible, in particular, to avoid problems during the reconstruction of the output signal from the partial output signals obtained by the filtering of the input time signal by the partial transfer functions H1, H2, . . . , HM.

The operations described in reference to FIGS. 3 and 4 are performed for each of the levels of the filter bank.

Thus according to a first possibility, for each level, the cyclical convolution product of the transfer function H(K) multiplied by the discrete Fourier transform G1(K), G4(K), . . . of the time window g1, . . . , g4, . . . of the level in question is calculated. In another possibility, the convolution product is obtained by the calculation of the inverse discrete Fourier transform h(m) of the transfer function H(K) followed by the calculation of the respective products h1(m), . . . , h4(m), . . . of the samplings h(m) multiplied by the samplings of the same rank in each sampled time window g1(m), . . . , g4(m), . . . defined in the time domain. A calculation of the discrete Fourier transform of these products h1(m), . . . , h4(m), . . . furnishes the sampling blocks [H1(K)], . . . , [H4(K)], .

As before, the samplings H1(K), . . . , H4(K), . . . are subjected to a subsampling of ratio L in order to furnish the desired partial transfer functions H1(k), . . . , H4(k), . . . .

The partial transfer functions H1, . . . , H4, . . . can be used to reconstruct an output signal defined by blocks of only N samplings but taking into account a time horizon greater than NT. The way to carry out this reconstruction by means of a filtering cell will now be described in reference to FIGS. 7 through 10.

Figure 7:
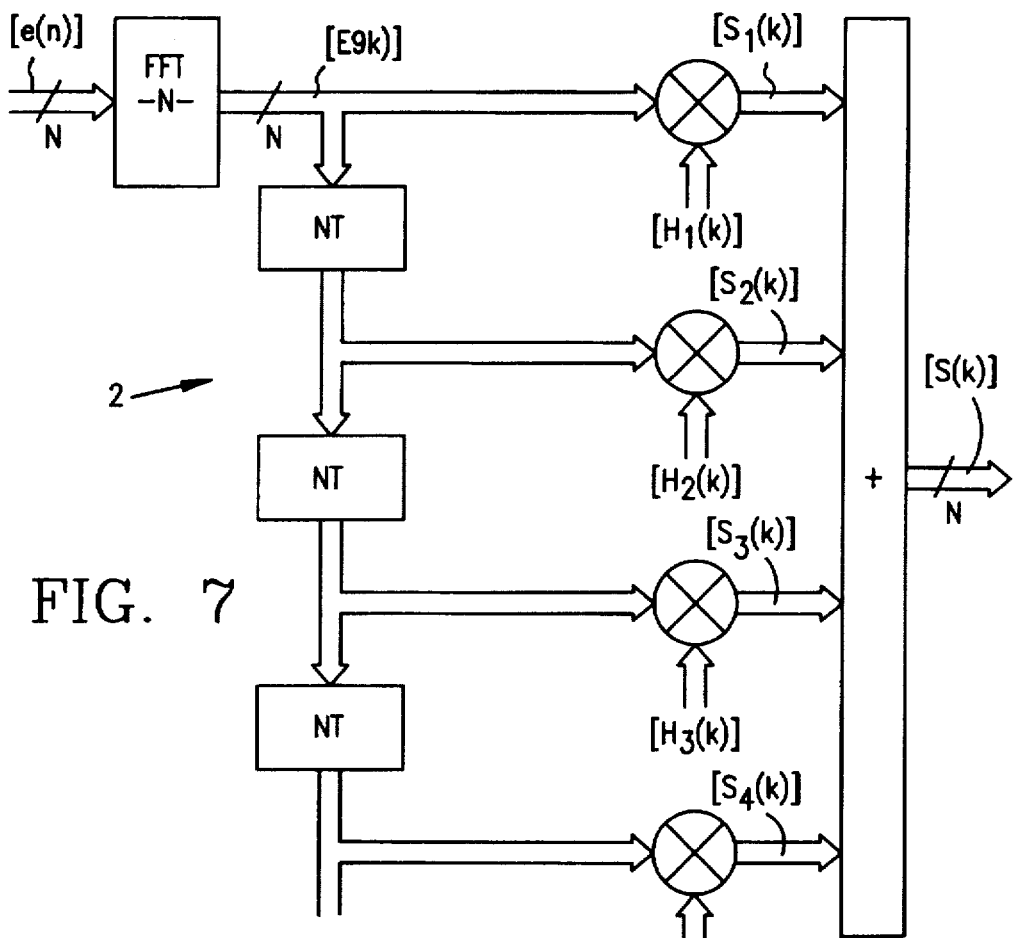
FIGS. 7 through 9 represent several variants of the embodiment of the filter bank according to the invention.

In a first possibility represented in FIG. 7, the filtering cell 2 constitutes M successive blocks of N samplings of the discrete Fourier transform [E(k)] by means of delay circuits connected to a shift register, for example. These delay circuits furnish at the output of the blocks shifted relative to one another by a time interval equal to NT. M multipliers obtain the products of the samplings of the partial transfer functions [H1(k)], . . . , [H4(k)], . . . , times the samplings of the same rank of the successive blocks which issue from the delay circuits. The multipliers furnish, at the output, M blocks of partial frequency signals of N samplings [S1(k)], [S4(k)], . . . which are then added in parallel in an adder whose output furnishes N samplings of the discrete Fourier transform S(k) of the output signal of the filter.

It is important to note that if M=L, a filtering is carried out over a time horizon of the input signal which is equal to the time horizon of the initial transfer function H(K).

Figure 8:
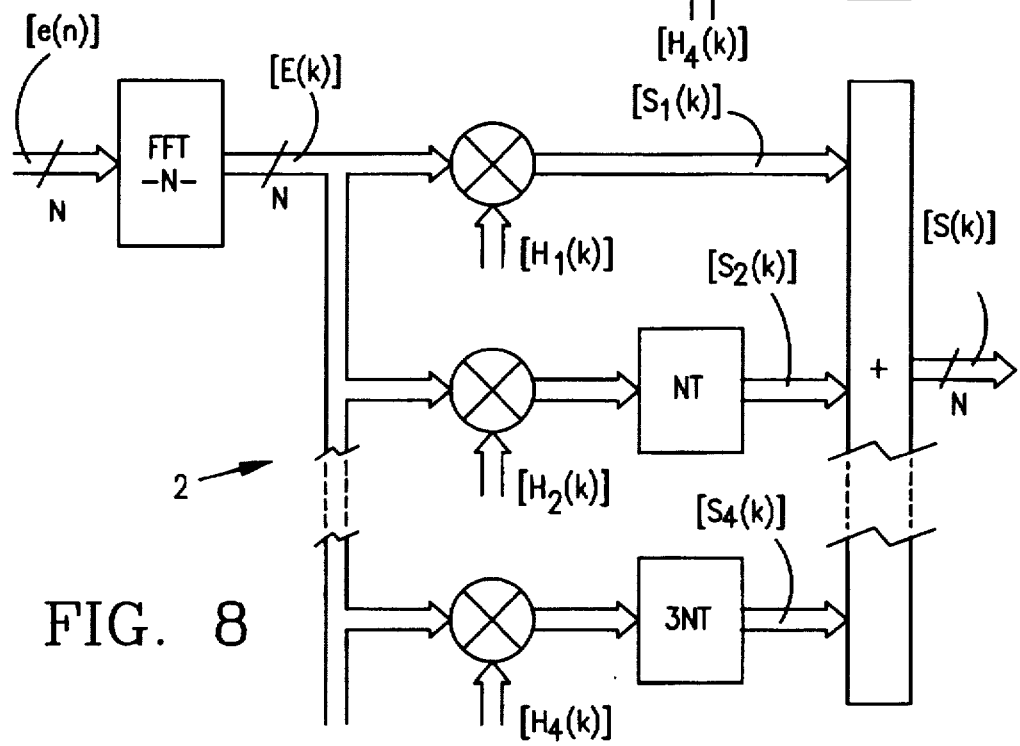

FIG. 8 represents a second variant of the embodiment of the filtering cell 2 which is functionally equivalent to that in FIG. 7. These two embodiments are distinguished from one another by the fact that the products and the delays are permutated.

Figure 9:
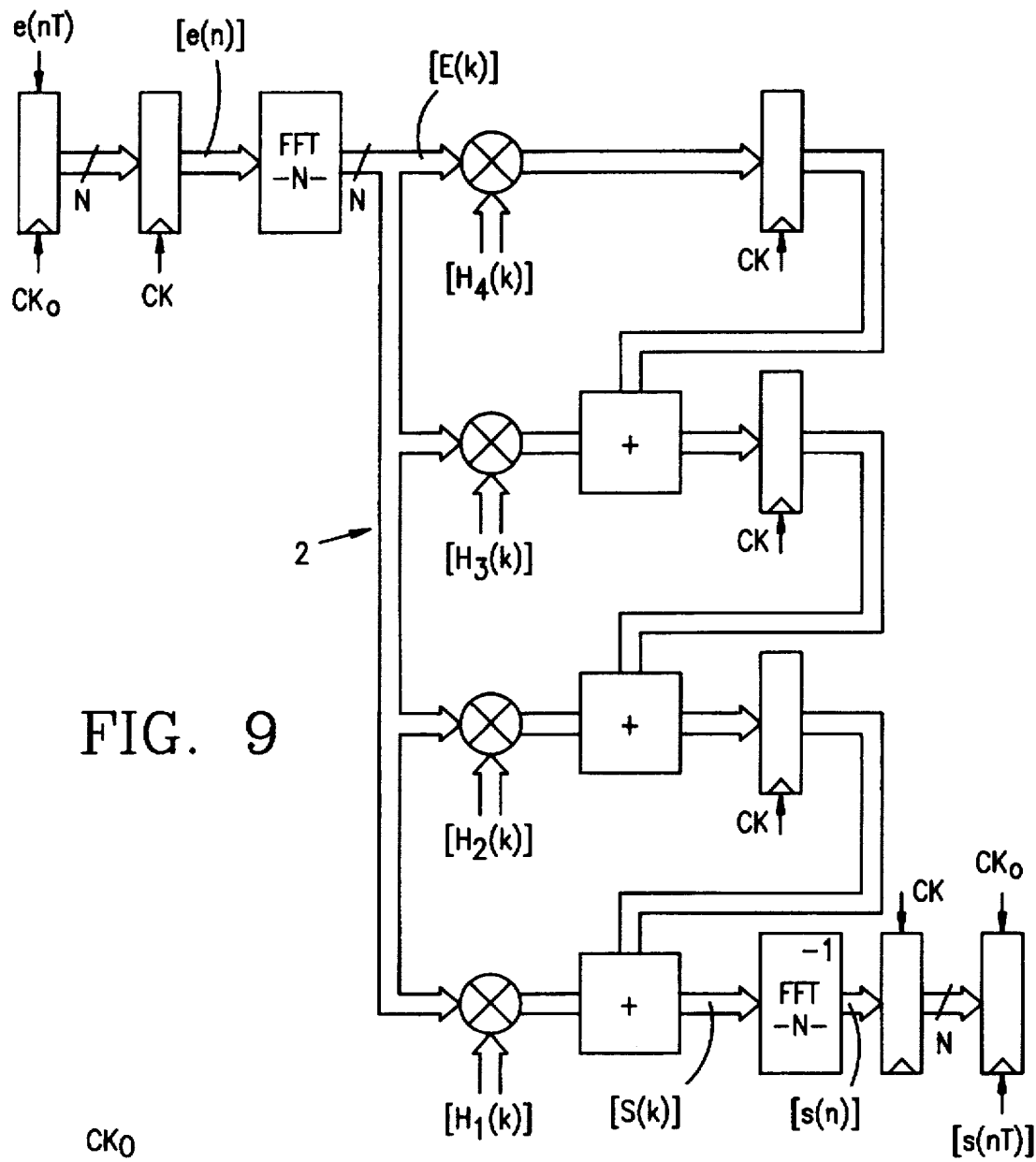

In another variant represented in FIG. 9 which corresponds to an example of a filter bank with four levels, the delay and addition operations are alternated so that the addition of M blocks of samples is replaced by a succession of additions of only two blocks each. This has the advantage of simplifying the embodiment of the adders and of consequently reducing the calculation time.

Figure 10:
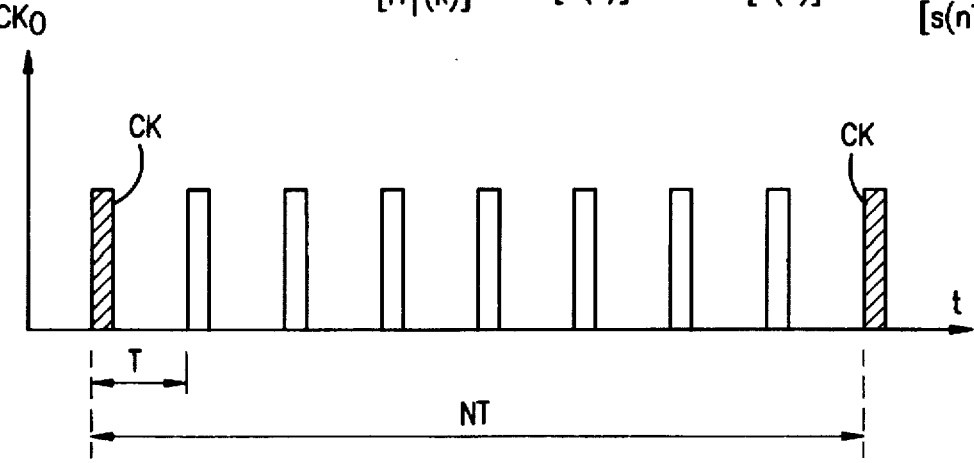
FIG. 10 represents the clock signal used to synchronize the circuit represented in FIG. 9.

The operation of the circuit in FIG. 9 is immediately apparent from the diagram and the timing diagram in FIG. 10, which show the sampling clock signal CK0 and the clock signal of the block CK used to synchronize the circuit.

Figure 11:
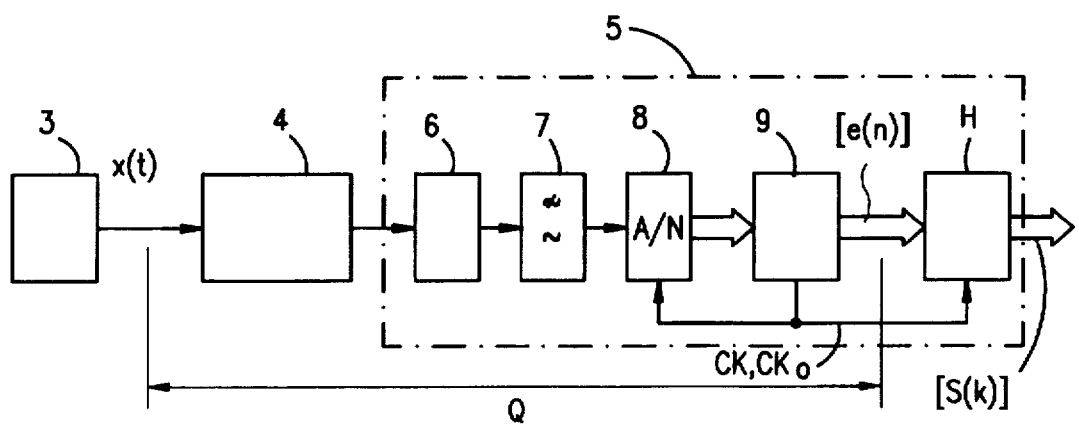
FIGS. 11 through 13 are diagrams which illustrate the application of the filter according to the invention to echo correction in a transmission channel.

In order to illustrate a particularly advantageous application of the filtering process according to the invention, FIG. 11 represents a general diagram of an example of a data transmission system, such as a television image transmission system.

In a conventional way, the system is constituted by an emitter 3, a transmission network 4, and a receiver 5. The receiver 5 is constituted by the cascading of a demodulator 6, a low-pass filter 7, an analog-to-digital converter 8 associated with an equalizer 9 and possibly an echo correction filter H advantageously embodied according to the invention. The equalizer 9 is provided both for recovering the clock signal of the signal received and for producing a suppression of the so-called "short" echos which are inevitably produced throughout the transmission channel Q.

However, the counterpart of the suppression of short echos by the equalizer 9 is the creation of so-called "long" echos which, although very weak, are detrimental to the quality of the image. That is why it is useful to provide the supplementary filter H intended for suppressing long echos. However, the processing of long echoes by definition presupposes that the filter H will have to account for a substantial time horizon of the signal to be filtered. That is why the process and the filter according to the invention are particularly well adapted to solving this problem without the necessity of providing bulky filters.

Figure 12:
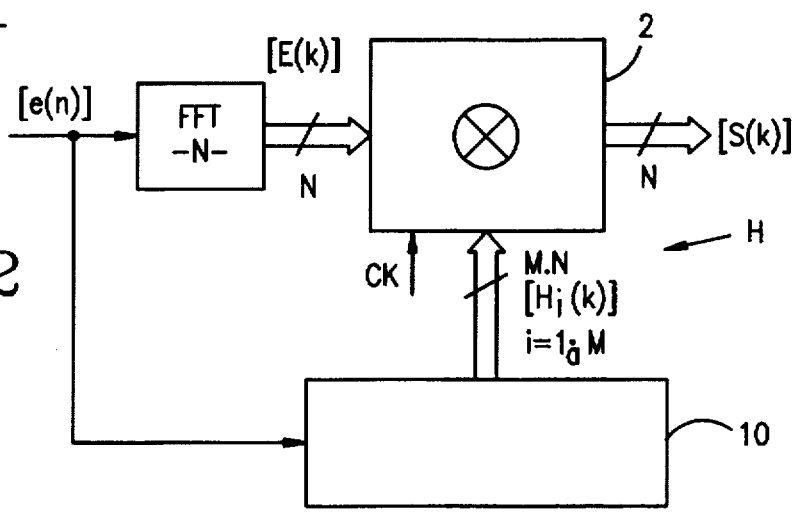

FIG. 12 represents an embodiment of the assembly of the filter H which is particularly useful for long echo correction. It is essentially composed of a filtering cell 2 in conformity with the invention connected on one hand to a calculator 10, and connected to the input signal [e(n)] by means of a fast Fourier transform circuit FFT-N. The calculator 10 receives the input signal in order to calculate the transfer function Q of the channel from a sweep signal transmitted by the emitter 3. The sweep signal allows the calculator to calculate with high precision the sampled transfer function in the frequency domain of the channel Q. The calculator can then calculate the inverse of this function Q in order to obtain the transfer function of the filter H after a possible correction to assure the stability of the filter. Advantageously, the calculator 10 could use an adaptation algorithm which makes it possible to regularly adjust the coefficients of the transfer function calculated. For example, line 624 of the signal D2-MAC could be used to transmit the sweep signal.

Finally, the calculator will be programmed to calculate the coefficients of the partial transfer functions H1, . . . , H4, . . . in conformity with the process according to the invention. Of course, if one transfer function H1 would be sufficient, it would be possible to use the same calculator with a cell 2 reduced to one multiplier. The opposite case would make it necessary to provide M partial transfer functions and consequently a cell 2 such that the product M.N.T. would be at least equal to the length of the echo to be corrected.

Figure 13:
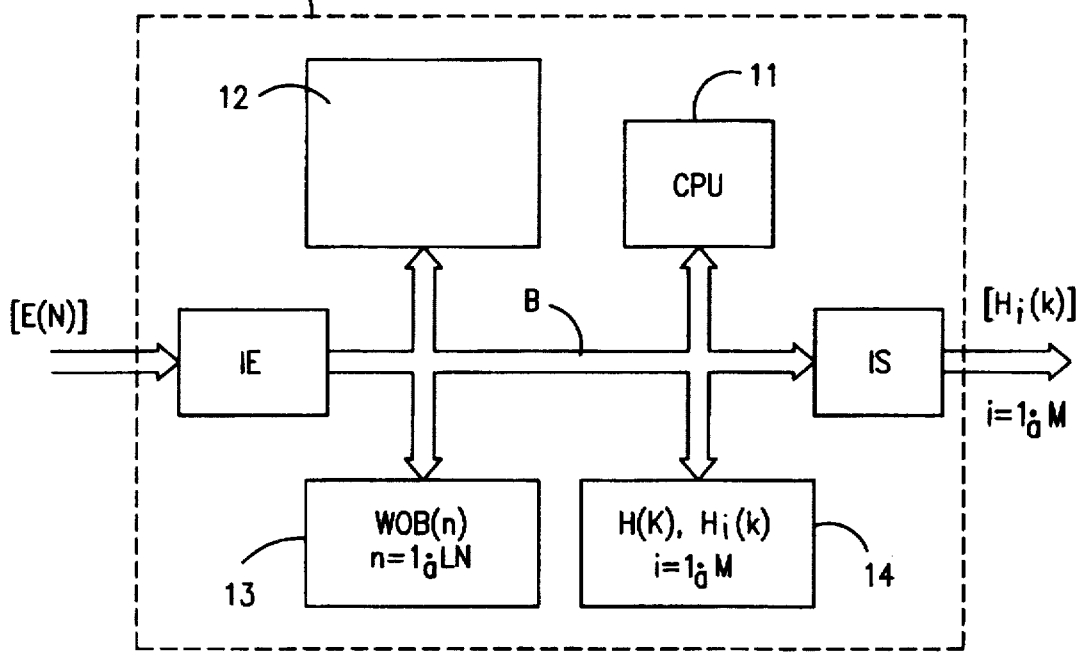

As one exemplary embodiment, FIG. 13 shows the principal elements which constitute the calculator 10. The calculator is organized around a bus B to which are connected a processor 11, a program memory 12, a first memory 13 for containing the samplings WOB(n) of the sweep signal and a second memory 14 provided for containing the calculated coefficients of the filter H as well as the partial transfer functions Hi. An input interface IE and an output interface IE enable the bus B to communicate with the input signal [e(n)] and the multipliers of the filtering cell 2, respectively.

Since the calculator just described is the conventional type, its detailed constitution and its operation do not require supplementary explanations, taking into account the indications already given above.

This mixed embodiment, which combines a programmed calculator 10 for calculating the coefficients with hardwired circuits for processing the signal in real time, seeks to optimize production costs while satisfying the performance criteria.

We claim:

1. A process for the filtering by means of a transfer function (H) of a digital time signal ((e(n))) sampled at a sampling period T and represented by its discrete Fourier transform ((E(k))) defined by blocks of N samplings in the frequency domain, said transfer function (H) being sampled ((H(K))) in the frequency domain and defined for a number LN of samplings, L being a whole number greater than or equal to 2, characterized in that, prior to the processing of the time signal ((e(n))), a partial transfer function ((H1(k))) is calculated which is defined in the frequency domain by the following steps:

definition of a function in the time domain, called a time window (g1), which has a value other than 0 within a time interval of a duration equal to N times the sampling period T, and which assumes a value of zero or tending toward zero outside said interval, calculation of the cyclic convolution product ((H1(K))) over LN samplings of said sampled transfer function ((H(K))) by the discrete Fourier transform ((G1(K)) of said time window (g1), subsampling of said convolution product ((H1(K))) in the ratio 1/L in order to define N samplings of said partial transfer function ((H1(k))), and multiplying said samplings of said partial transfer function ((H1(k))) by the samplings of the same rank of said discrete Fourier transform ((E(k))) of said time signal ((e(n))) to obtain respective products ((S1(k))) in real time in order to produce an output signal corrected for channel echo introduced by a transmission channel over which an input signal corresponding to the digital time signal ((e(n))) has passed.

2. The filtering process according to claim 1, characterized in that said time window (g1) being a sampled function, said cyclic convolution product ((H1(k))) consists of carrying out a calculation of the inverse discrete Fourier transform ((h(m))) of said sampled transfer function ((H(K))), obtaining the respective products ((h1(m))) of the samplings of said inverse discrete Fourier transform ((h(m))) multiplied by the samplings of the same rank of said sampled time window (g1), and calculating the discrete Fourier transform ((H1(K))) of said products ((H1(m))).

3. The filtering process according to claim 1, characterized in that said time window (g1) is chosen so that its integral relative to time is equal to N times the sampling period T.

4. An application of the filtering process according to claim 1 to echo correction in a transmission channel, characterized in that the filtering affects a sampled digital time signal which is present at the level of a receiver connected to said transmission channel, said transfer function (H) being determined from the calculation of the inverse of the transfer function (Q) in the frequency domain of said channel.

5. The application of the filtering process according to claim 4, characterized in that said transfer function of the channel is determined by means of a sweep signal produced by an emitter connected to the other end of said channel.

6. A digital filter for implementing the filtering process according to claim 1, characterized in that it includes a digital calculator programmed to calculate said samplings of said partial transfer function (H1(k)) and equipped with an output interface which makes it possible to issue said samplings, and in that said filter includes hardwired circuits for calculating said discrete Fourier transfer (E(k)) of the time signal (e(n)) as well as the product of said samplings of said partial transfer function (H1(k)) multiplied by the samplings of the same rank of the discrete Fourier transform (E(k)) of the time signal (e(n)).

7. A process for the filtering by means of a transfer function (H) of a digital time signal (e(n)) sampled at a sampling period T and represented by its discrete Fourier transform ((E(k))) defined by blocks of N samplings in the frequency domain, said transfer function (H) being sampled ((H(K)) in the frequency domain and defined for a number LN of samplings, L being a whole number greater than or equal to 2, characterized in that, prior to the processing of the time signal, M partial transfer functions ((H1(k))), . . . , ((H4(k))) are calculated, which are defined in the frequency domain by the following steps:

definition of M successive time intervals, each having a duration equal to N times the sampling period T, for each of said intervals, definition in the time domain of a function, called a time window, (g1, . . . , g4) which has a value other than zero within the associated time interval and which assumes a value of zero or tending toward zero outside said interval, calculation of the cyclic convolution products ((H1(K)), . . . , (H4(K))) over LN samplings of said sampled transfer function multiplied by the respective discrete Fourier transforms ((G1(K)), . . . , (G4(K))) of said time windows (g1, . . . , g4), subsampling of said convolution products ((H1(K)), . . . , (H4(K))) in the ratio 1/L so as to define N samplings of each of said partial transfer functions ((H1(k)), . . . , (H4(k))), multiplying said M partial transfer functions ((H1(k)), . . . , (H4(k))) by samplings of the same rank of M successive blocks of N samplings of said discrete Fourier transform ((ER(k))) of the time signal ((e(n)))to obtain partial frequency signals, summing the partial frequency signals organized into M blocks of N samplings in real time in order to produce an output signal corrected for channel echo introduced by a transmission channel over which an input signal corresponding to the digital time signal ((e(n))) has passed.

8. The filtering process according to claim 7, characterized in that each of said time windows is chosen in such a way that its integral relative to time is equal to N times the sampling period T, so that the sum of two adjacent time windows is equal to unity.

9. The application of the filtering process according to claim 7 for echo correction in a transmission channel, characterized in that said digital time signal (e(n)) is a signal which is present at the level of a receiver connected to one end of said channel, in that said transfer function (H) is the inverse of the transfer function (Q) of said channel, in that said M time intervals are adjacent and in that the numbers N and M are chosen in such a way that the product M.N.T. is at least equal to the length of the echo to be corrected.

10. A digital filter for implementing the filtering process according to claim 7, characterized in that it includes a digital calculator programmed to calculate said samplings of said partial transfer functions (H1(k)) and equipped with an output interface which makes it possible to issue said samplings, and in that said filter includes hardwired circuits for calculating said discrete Fourier transform (E(k)) of the time signal (e(n)) as well as the products of said samplings of said partial transfer functions (H1(k)) multiplied by the samplings of the same rank of the discrete Fourier transform (E(k)) of the time signal (e(n)).

11. A process for the filtering by means of a transfer function (H) of a digital time signal ((e(n))) sampled at a sampling period T and represented by its discrete Fourier transform ((E(k))) defined by blocks of N samplings in the frequency domain, said transfer function (H) being sampled ((H(K))) in the frequency domain and defined for a number LN of samplings, L being a whole number greater than or equal to 2, characterized in that, prior to the processing of the time signal ((e(n))), M partial transfer functions ((H1(k)), . . . , (H4(k))) are calculated, which are defined in the frequency domain by the following steps:

definition of M successive time intervals, each of which has a duration equal to N multiplied by the sampling period T, for each of said intervals, definition in the time domain of a function, called a time window (g1, . . . , g4), which has a value other than zero within the associated time interval and which assumes a value of zero or tending toward zero outside said interval, calculation of the cyclic convolution products ((H1(K)), . . . , (H4(K))) over LN samplings of said sampled transfer function ((H(K)) multiplied by the respective discrete Fourier transforms ((G1(K)), . . . , (G4(K))) of said time windows (g1, . . . , G4), subsampling of said convolution products ((H1(K)), . . . , (H4(K))) in the ratio 1/L so as to define N samplings of each of said partial transfer functions (H1(k)), . . . , H4(k))), obtaining M successive products of the samplings of said M partial transfer functions (H1(k), . . . , (H4(k))) multiplied by the samplings of the same rank of N samplings of said discrete Fourier transform (E(k))) of the time signal ((e(n)), thus obtaining partial frequency signals, and summing in real time the partial frequency signals organized into M blocks of N samplings ((S1(k), . . . , S4(k))), in order to produce an output signal corrected for channel echo introduced by a transmission channel over which an input signal corresponding to the digital time signal ((e(n))) has passed.

12. The filtering process according to claim 11, characterized in that said time windows (g1, . . . , g4) being sampled functions, each of said cyclic convolution products (H1(k)) consists of carrying out a calculation of the inverse discrete Fourier transform (h(m)) of said sampled transfer function (H(K)), obtaining the respective products (h1(m)) of the samplings of said inverse discrete Fourier transform (h(m)) multiplied by the samplings of the same rank in each of said sampled time windows (g1), and calculating the discrete Fourier transform (H1(K)) of said products (h1(m)).

\* \* \* \* \*